US012300517B2

(12) United States Patent
Lee et al.

(10) Patent No.: US 12,300,517 B2
(45) Date of Patent: May 13, 2025

(54) APPARATUS FOR TREATING SUBSTRATE AND TEMPERATURE CONTROL METHOD

(71) Applicant: SEMES CO., LTD., Cheonan-si (KR)

(72) Inventors: Sang Min Lee, Seoul (KR); Young Hun Lee, Cheonan-si (KR); Myung Seok Cha, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 640 days.

(21) Appl. No.: 17/547,182

(22) Filed: Dec. 9, 2021

(65) Prior Publication Data

US 2022/0189795 A1 Jun. 16, 2022

(30) Foreign Application Priority Data

Dec. 10, 2020 (KR) .................. 10-2020-0172541

(51) Int. Cl.
*H01L 21/67* (2006.01)
(52) U.S. Cl.
CPC .. *H01L 21/67034* (2013.01); *H01L 21/67109* (2013.01)
(58) Field of Classification Search
CPC ....... F26B 5/005; F26B 7/00; H01L 21/67034
See application file for complete search history.

(56) References Cited

U.S. PATENT DOCUMENTS

| 2004/0221875 | A1* | 11/2004 | Saga | ................. | H01L 21/67057 |
| | | | | | 134/26 |
| 2012/0102778 | A1* | 5/2012 | Kashkoush | ....... | H01L 21/02057 |
| | | | | | 134/30 |
| 2014/0360041 | A1 | 12/2014 | Jeong et al. | | |
| 2015/0176897 | A1* | 6/2015 | Jun | ................... | H01L 21/67034 |
| | | | | | 34/218 |
| 2015/0255315 | A1* | 9/2015 | Miya | ..................... | B08B 7/0014 |
| | | | | | 134/4 |

FOREIGN PATENT DOCUMENTS

| CN | 201232252 | 5/2009 |
| JP | 06108903 | 4/1994 |
| JP | 07-302778 | 11/1995 |
| JP | 2004268019 | 9/2004 |
| JP | 2005-187879 | 7/2005 |
| JP | 2015534478 | 12/2015 |
| JP | 2018080648 | 5/2018 |
| KR | 10-2004-0026639 | 3/2004 |
| KR | 100872873 | 12/2008 |
| KR | 1020140144806 | 12/2014 |
| KR | 101590906 | 6/2015 |
| KR | 1020160135035 | 11/2016 |
| WO | 2010041308 | 4/2010 |

* cited by examiner

*Primary Examiner* — David J Laux

(57) ABSTRACT

The inventive concept provides a temperature controlling method. The temperature controlling method for controlling a temperature of a tank storing a treating fluid transferred to the chamber, comprises supplying the treating fluid to the inner space of the tank, heating the treating fluid at the inner space, and transferring the heated treating fluid to the chamber, wherein the temperature of the inner space is controlled based on a measured pressure of the inner space.

13 Claims, 9 Drawing Sheets

APPARATUS FOR TREATING SUBSTRATE AND TEMPERATURE CONTROL METHOD

CROSS-REFERENCE TO RELATED APPLICATIONS

A claim for priority under 35 U.S.C. § 119 is made to Korean Patent Application No. 10-2020-0172541 filed on Dec. 10, 2020, in the Korean Intellectual Property Office, the entire contents of which are hereby incorporated by reference.

BACKGROUND

Embodiments of the inventive concept described herein relate to an apparatus for treating a substrate and a temperature control method, more specifically, an apparatus for treating a substrate using a high-pressure treating fluid and a temperature control method within a tank storing the treating fluid transferred to a chamber of the substrate treating apparatus.

Various processes such as a photolithography process, an etching process, an ashing process, an ion implantation process, and a thin film deposition process are carried out to manufacture a semiconductor device. At each of the processes, various treating liquids and treating gases are used and during a process, particles and process by-products are generated. A cleaning process is performed before and after each process to remove these particles and process by-products from the substrate.

In a conventional cleaning process, the substrate is treated with chemicals and a rinsing liquid before a drying treatment. As an example of the drying treatment, there is a rotating drying process that rotates the substrate at a high speed and removes the rinsing liquid remaining on the substrate. However, such a rotating drying method may tear down a pattern formed on the surface of the substrate.

Accordingly, recently a supercritical drying process, of supplying an organic solvent such as isopropyl alcohol (IPA) on the substrate to replace the rinsing liquid remaining on the substrate with an organic solvent having a low surface tension and then supplying a treating fluid in a supercritical state on the substrate to remove the organic solvent remaining on the substrate, is being used. In the supercritical drying process, a drying gas is supplied to a process chamber with a sealed inside, and the drying gas is heated and pressurized. Accordingly, both the temperature and pressure of the drying gas rise above the threshold point, and the drying gas phase-changes to the supercritical state.

FIG. 1 is a view illustrating a conventional substrate treatment apparatus for performing a supercritical drying process, and FIG. 2 is a graph illustrating a change in a pressure and a temperature of an inner space of a tank of FIG. 1, and a change in a pressure of a treating space of a supercritical chamber. Referring to FIG. 1 and FIG. 2, a conventional substrate treatment apparatus 1 performing a supercritical drying process includes a tank 2, a heater 4, a first gas supply pipe 5, a second gas supply pipe 6, a temperature sensor 7, a pressure sensor 8, and a supercritical chamber 9. In addition, in the graph shown in FIG. 2, the X-axis represents time t, the Y-axis represents the pressure PT of the inner space of the tank, the temperature FT of the inner space of the tank, and the pressure PC of the treating space of the supercritical chamber, respectively.

The supercritical chamber 9 has a treating space for drying a substrate W such as a wafer. The tank 2 has an inner space 3. A treating fluid is supplied to the inner space 3 of the tank 2 by the first gas supply pipe 5. The tank 2 may store the treating fluid supplied to the inner space 3. The treating fluid stored in the inner space 3 is heated by the heater 4 and supplied to the treating space of the supercritical chamber 9 through the second gas supply pipe 6 in a heated state. When the treating fluid heated to the supercritical chamber 9 is supplied, the pressure of the treating space of the supercritical chamber 9 is increased to a preset pressure. Thereafter, the pressure of the treating space is maintained for a predetermined period of time. Thereafter, the treating fluid is discharged from the treating space, and the pressure of the treating space of the supercritical chamber 9 is lowered.

In addition, the pressure in the inner space 3 of the tank 2 should be kept constant at a set pressure SP and a set temperature ST. This is to suppress an occurrence of deviations according to a time point at which the temperature of the treating fluid transferred to the supercritical chamber 9 is supplied. In addition, the pressure in the inner space 3 of the tank 2 is maintained relatively constant to ensure facility stability of the substrate treating apparatus 1. Accordingly, in the inner space 3 of the tank 2, a pressure sensor 8 for measuring the pressure of the inner space 3 and a temperature sensor 7 for measuring the temperature of the inner space 3 are disposed to keep the temperature and the pressure of the inner space 3 constant.

For example, as illustrated in FIG. 2, when the treating fluid is supplied from the tank 2 to the supercritical chamber 9 at a first time point t01, the pressure of the inner space 3 of the tank 2 is lowered. In order to increase the lowered pressure of the inner space 3, a new treating fluid is introduced into the inner space 3 of the tank 2 through the first gas supply pipe 5 based on a pressure value of the inner space 3 measured by the pressure sensor 8. When the new treating fluid flows into the inner space 3, the temperature of the inner space 3 decreases. Based on a temperature value of the inner space 3 measured by the temperature sensor 7 to increase the lowered temperature of the inner space 3, the heater 4 increases the temperature of the inner space 3.

However, a temperature of the new treating fluid flowing into the inner space 3 of tank 2 is somewhat low. That is, in the inner space 3 of the tank 2, a temperature of a region A adjacent to the first gas supply pipe 5 and a temperature of a region B adjacent to the second gas supply pipe 6 may be different from each other. That is, the temperature value of the inner space 3 measured by the temperature sensor 7 may vary depending on the position where the temperature sensor 7 is disposed in the inner space 3. In other words, an accuracy of the temperature value measured by the temperature sensor 7 is poor. In addition, since the heater 4 heats the inner space 3 in accordance with the temperature value measured by the temperature sensor 7, the reaction speed of the heater 4 is affected by a change in the temperature value measured by the temperature sensor 7. However, as described above, the temperature value measured by the temperature sensor 7 is relatively less accurate and the measurement reaction speed of the temperature sensor 7 is also slow, so a reaction speed of the heater 4 is also slow.

In addition, at a fourth time t04 at which the supercritical treating process of the substrate is completed in the supercritical chamber 9, the treating fluids supplied to the treating space of the supercritical chamber 9 are discharged from the supercritical chamber 9. Accordingly, a pressure of the supercritical chamber 9 is lowered. In addition, from the fourth time point t04, the supplying of the treating fluid from the inner space 3 of the tank 2 to the treating space of the supercritical chamber 9 is stopped. In addition, in order to increase the pressure of the inner space 3 lowered before the fourth time point t04, the treating fluid is continuously supplied to the inner space 3. At a fifth time point t05, the pressure in the inner space 3 reaches the set pressure SP. However, after reaching the set pressure SP, the pressure in the inner space 3 increases to a higher pressure. This is because the new treating fluid is introduced into the inner space 3, so that the temperature of the inner space 3 is lowered, and the heater 4 heats the tank 2 to increase the lowered temperature of the inner space 3. Since the temperature and the pressure are proportional to each other, when the heater 4 heats the tank 2 to increase the temperature of the inner space 3, the pressure of the inner space 3 of the tank 2 becomes higher than the set pressure SP. Accordingly, in order to lower again the pressure of the inner space 3 that has become higher than the set pressure SP, the treating fluid supplied to the inner space 3 is discharged through a vent line (not shown) to outside of the tank 2. When the treating fluid is discharged to the outside through the vent line, the pressure in the inner space 3 is lowered again. In this case, the pressure of the inner space 3 may drop to a lower level than the set pressure SP. When the pressure in the inner space 3 drops to a lower level than the set pressure SP, a new treating fluid is supplied back to the inner space 3. When the new treating fluid is supplied back to the inner space 3, the temperature of the inner space 3 drops again. When the temperature of the inner space 3 drops, the heater 4 heats the tank 2 again. That is, an over-shooting phenomenon occurs between a fifth time point t05 and a sixth time point t06 in FIG. 2. That is, in the process of maintaining the pressure and the temperature of the inner space 3 at the set pressure SP and the set temperature ST between the fifth time point t05 and the sixth time point t06, there is a problem that the treating fluid is unnecessarily consumed.

SUMMARY

Embodiments of the inventive concept provide a temperature control method and a substrate treating apparatus for efficiently controlling a temperature of a treating fluid.

Embodiments of the inventive concept provide a temperature control method and a substrate treating apparatus for minimizing an occurrence of an over-shooting phenomenon.

Embodiments of the inventive concept provide a temperature control method and a substrate treating apparatus for efficiently controlling a temperature and a pressure of an inner space of the tank.

Embodiments of the inventive concept provide a temperature control method and a substrate treating apparatus for precisely controlling a temperature of an inner space of a tank.

The technical objectives of the inventive concept are not limited to the above-mentioned ones, and the other unmentioned technical objects will become apparent to those skilled in the art from the following description.

The inventive concept provides a temperature within a tank storing a treating fluid transferred to a chamber, the method comprising: supplying the treating fluid to an inner space of the tank; heating the treating fluid at the inner space; and transferring the heated treating fluid to the chamber, and wherein the temperature of the inner space is controlled based on a measured pressure of the inner space.

In an embodiment, the temperature of the inner space is controlled such that the pressure of the inner space may reach a predetermined pressure.

In an embodiment, the temperature of the inner space is increased such that the pressure of the inner space may reach the predetermined pressure when the pressure of the inner space is lower than the predetermined pressure.

In an embodiment, the temperature of the inner space is controlled by at least one of a first temperature controlling member controlling the temperature of the inner space by generating a heat from outside of the tank, or a second temperature controlling member controlling the temperature of the inner space by generating a heat at the inner space.

In an embodiment, a bimetal is installed to contact the tank and is connected to a power supply line supplying power to the first temperature controlling member or the second temperature controlling member, so the supplying of power is blocked when a temperature of the tank rises above a predetermined temperature.

In an embodiment, the pressure of the inner space is measured by a pressure measuring member, the pressure measuring member being installed at a supply line in communication with the inner space and supplying the treating fluid to the inner space or the supply line being installed at the inner space.

In an embodiment, the treating fluid is supplied to the inner space in a gaseous state, and wherein at least a portion of the treating fluid is phase-changed to a supercritical state in the inner space and transferred to the chamber.

The inventive concept provides a substrate treating apparatus comprising: a chamber having a treating space for treating a substrate; a fluid supply unit configured to supply a treating fluid to the treating space; and a controller, wherein the fluid supply unit comprises: a tank having an inner space; a first supply line supplying the treating fluid to the inner space; a second supply line transferring the treating fluid from the inner space to the treating space; a temperature controlling member controlling a temperature of the inner space; and a pressure measuring member measuring a pressure of the inner space, wherein the controller controls the temperature controlling member to control the temperature of the inner space, based on a measured pressure of the inner space measured by the pressure measuring member.

In an embodiment, the controller controls the temperature controlling member to adjust the temperature of the inner space so the pressure of the inner space may reach a predetermined pressure.

In an embodiment, the controller, when the pressure of the inner space is lower than the predetermined pressure, controls the temperature controlling member to increase the temperature of the inner space so the pressure of the inner space may reach the predetermined pressure.

In an embodiment, the temperature controlling member comprises at least one of a first temperature controlling member surrounding the tank, or a second temperature controlling member controlling the temperature of the inner space by generating a heat at the inner space.

In an embodiment, the second temperature controlling member comprises: a shaft; and at least one heating plate installed at the shaft.

In an embodiment, the fluid supply unit further comprises a bimetal, and the bimetal is installed to contact the tank and connected to a power supply line supplying power to the temperature controlling member.

In an embodiment, the fluid supply unit further comprises a bimetal, and the bimetal is installed to contact the tank and connected to a signal line delivering a signal generated by the controller.

In an embodiment, the first supply line supplies the fluid in a gaseous state to the inner space, and the temperature adjustment member heats the inner space to phase-change the treating fluid supplied to the inner space in a gaseous state to a supercritical state.

In an embodiment, the pressure measuring member is placed in the inner space, or installed on the first supply line.

The inventive concept provides a substrate treating apparatus comprising: a chamber having a treating space for treating a substrate using a treating fluid in a supercritical state; a fluid supply unit configured to supply a treating fluid to the treating space; and a controller controlling the fluid supply unit, wherein the fluid supply unit comprises: a tank having an inner space; a first supply line supplying the treating fluid to the inner space; a second supply line transferring the treating fluid from the inner space to the treating space; a heater transferring a heat to an atmosphere of the inner space; and a pressure measuring member measuring a pressure of the inner space, wherein the controller controls the heater to transfer the heat to the atmosphere of the inner space so the pressure of the inner space measured by the pressure measuring member may reach a predetermined pressure.

In an embodiment, the controller controls the heater to increase the temperature of the inner space, so the pressure of the inner space may reach the predetermined pressure, when the pressure of the inner space measured by the pressure measuring member is lower than the predetermined pressure.

In an embodiment, the fluid supply unit further comprises a second valve installed at the second supply line, and the controller sets the second valve 'On' or 'Off' at least once.

In an embodiment, the fluid supply unit further comprises a bimetal, and the bimetal is installed to contact the tank and connects to a power supply line supplying power to the heater.

According to an embodiment of the inventive concept, a temperature of a treating fluid may be treated efficiently controlled.

According to an embodiment of the inventive concept, an occurrence of an over-shooting phenomenon may be minimized.

According to an embodiment of the inventive concept, a temperature and a pressure of an inner space of a tank may be efficiently controlled.

According to an embodiment of the inventive concept, a temperature of an inner space of the tank may be precisely controlled.

The effects of the inventive concept are not limited to the above-described effects, and effects not mentioned may be clearly understood by those skilled in the art from the present specification and the accompanying drawings.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
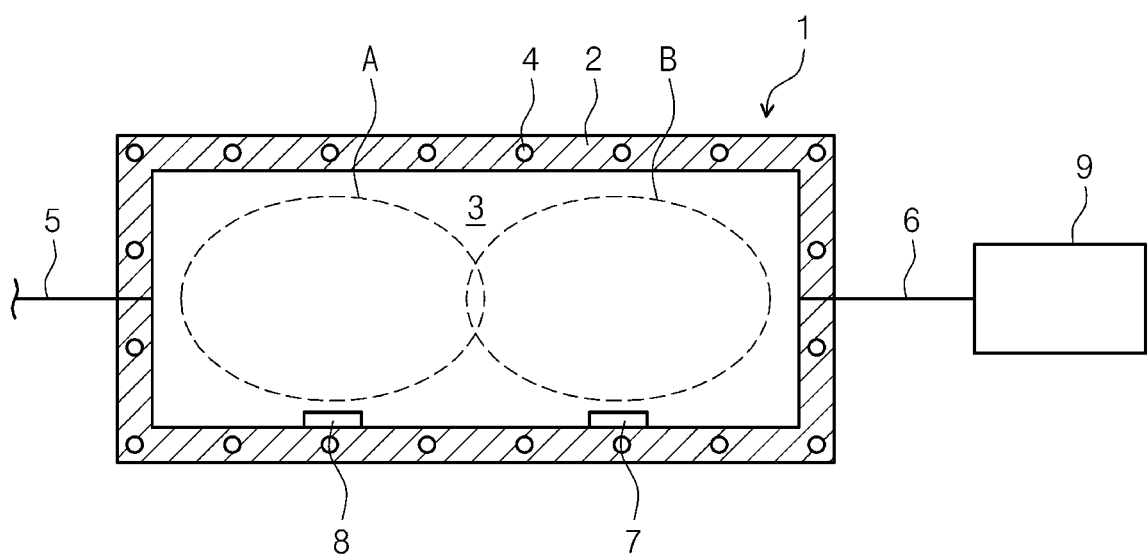
FIG. 1 is a view illustrating a conventional substrate treating apparatus performing a supercritical drying treatment.
Figure 2:
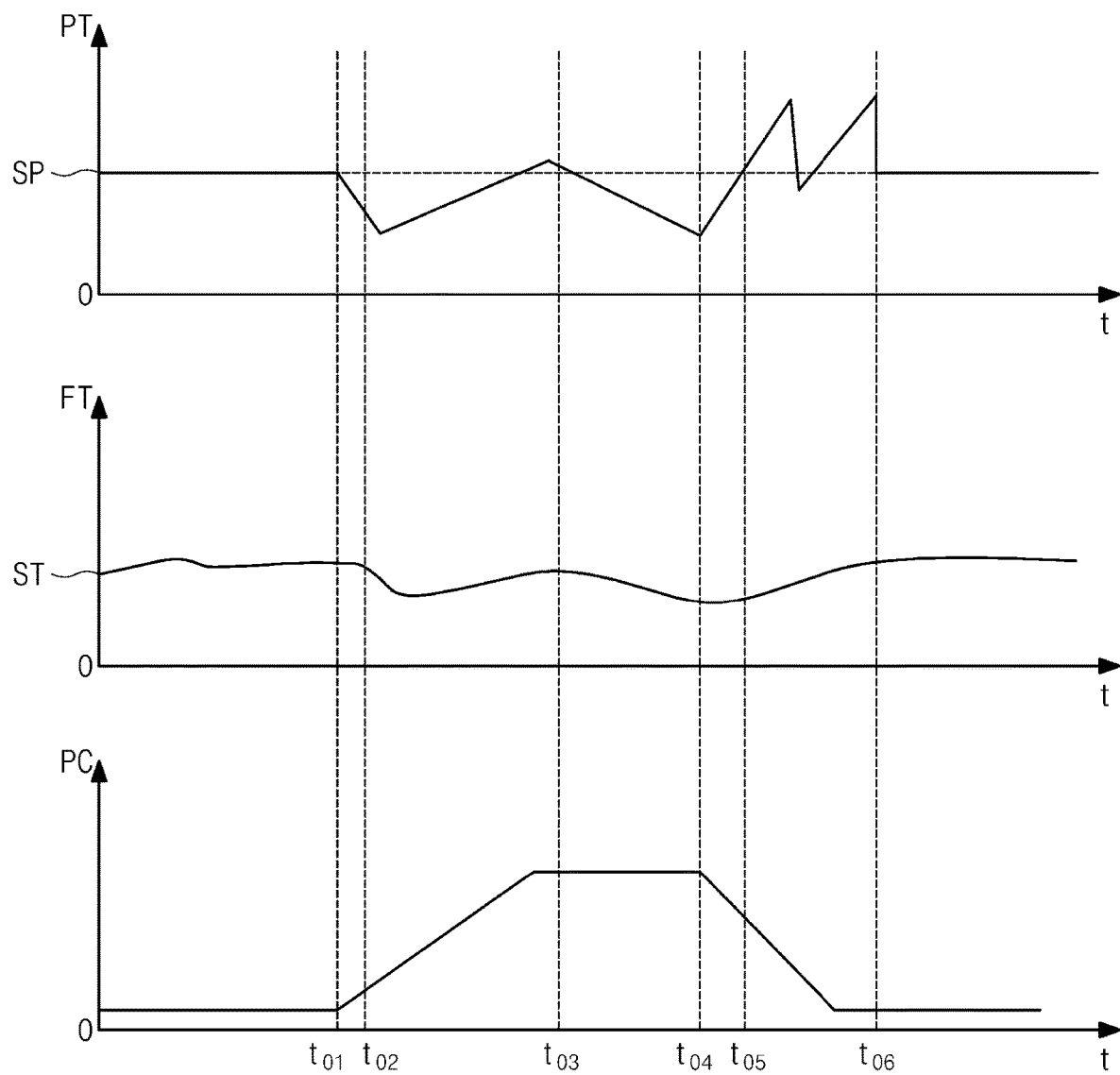
FIG. 2 is a graph illustrating a change of a pressure and a temperature of an inner space of the tank of FIG. 1, and a change of a pressure of a treating space of a supercritical chamber.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

Singular expressions include plural expressions unless they explicitly have a different meaning in the context. In addition, the shape and size of the elements in the drawings may be exaggerated for clearer explanation.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It will be understood that when an element or component is referred to as being "on", "connected to", "coupled to", or "adjacent to" another element or component, it can be directly on, connected, coupled, or adjacent to the other element or component, or intervening elements or components may be present. In contrast, when an element is referred to as being "directly on," "directly connected to", "directly coupled to", or "immediately adjacent to" another element or component, there are no intervening elements or components present. Other expression explaining the relationship between elements such as when an element is referred to as being "between" another two elements, it can be directly between another two elements or indirectly between another two elements.

Unless otherwise defined, all terms used herein, including technical or scientific terms, have the same meaning as those generally understood by those skilled in the art to which the inventive concept belongs. Terms such as those defined in commonly used dictionaries should be interpreted as consistent with the context of the relevant technology and not as ideal or excessively formal unless clearly defined in this application.

Hereinafter, embodiments of the inventive concept will be described in detail with reference to FIG. 3 to FIG. 10.

Figure 3:
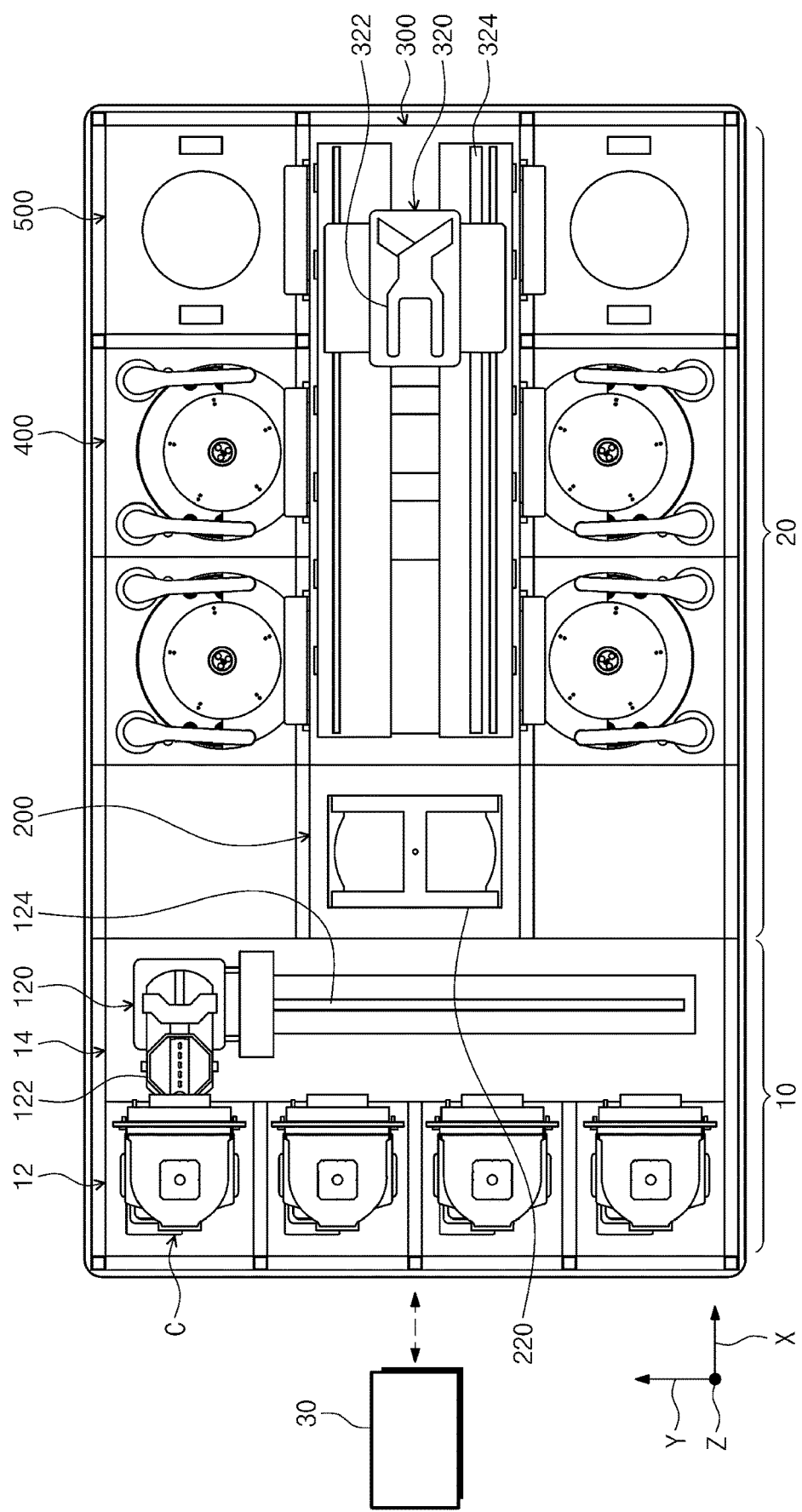
FIG. 3 is a view illustrating a substrate treating apparatus according to an embodiment of the inventive concept.

FIG. 3 illustrates a substrate treating apparatus according to an embodiment of the inventive concept. The substrate treating apparatus comprises an index module 10, a treating module 20, and a controller 30. When viewed from above, the index module 10 and the treating module 20, are sequentially arranged in a row. Hereinafter, a direction in which the index module 10 and the treating module 20 are arranged will be referred to as a first direction X, a direction that is perpendicular to the first direction X when viewed from above will be referred to as a second direction Y, and a direction that is perpendicular to both the first direction X and the second direction Y will be referred to as a third direction Z.

The index module 10 transfers the substrate W from the container C in which the substrate W is stored to the treating module 20, and the treating module 20 gets the treated substrate W to be stored in the container C. The index module 10 is provided with its length extending along the second direction Y. The index module 10 has a load port 12 and an index frame 14. The index frame 14 is placed between the load port 12 and the treating module 20. The container C in which the substrates W are stored is placed at the load port 12. A plurality of load ports 12 may be provided, and the plurality of load ports 12 may be placed along the second direction Y.

For the container C, a closing-type container C such as a front open unified pod (FOUP) can be used. The container C can be placed on the load port 12 by a transfer means (not shown) such as an overhead transfer, an overhead conveyor, or an automatic guided vehicle, or the container C may be placed on the load port 12 by an operator.

An index robot 120 is provided inside the index frame 14. In the index frame 14, a guide rail 124 is provided with its length extending along the second direction Y, and the index robot 120 may be provided movable on the guide rail 124. The index robot 120 includes a hand 122 on which the substrate W is placed, and the hand 122 may be provided to be forwardly and backwardly movable, rotatable with the third direction Z as an axis, and movable along the third direction Z. A hand 122 may be provided in a plurality and placed apart in an up/down direction, and the hands may be provided to be independently forwardly and backwardly movable, respectively.

The controller 30 may control the substrate treating apparatus. The controller 30 may comprise a process controller including a microprocessor (computer) that executes control of the substrate treating apparatus, a user interface such as a keyboard via which an operator inputs commands to manage the substrate treating apparatus and/or a display showing the operating situation of the substrate treating apparatus, and a memory unit storing a treating recipe, i.e., a control program to execute treating processes of the substrate treating apparatus by controlling the process controller or a program to execute components of the substrate treating apparatus according to data and treating condition. In addition, the user interface and the memory unit may be connected to the process controller. The treating recipe may be stored in a storage medium of the storage unit, and the storage medium may be a hard disk, a portable disk such as a CD-ROM, a DVD, or a semiconductor memory such as a flash memory.

Also, the controller 30 may control a fluid supply unit 600 to be described later. For example, the controller 30 may control at least one of a first valve 621 to be described later, a second valve 631, a top valve 634, a bottom valve 636, or a temperature controlling member 650. Also, the controller 30 may control a temperature controlling member 650 to be described later based on a pressure measurement measured by the pressure measuring member 640 to be described later.

The treating module 20 includes a buffer unit 200, a transfer chamber 300, a liquid treating chamber 400, and a drying chamber 500. The buffer unit 200 provides a space in which the substrate W carried into the treating module 20 and the substrate W carried out from the treating module 20 temporarily stay. The liquid treating chamber 400 supplies a liquid onto the substrate W to perform a liquid treatment process of liquid treatment on the substrate W. The drying chamber 500 performs a drying process of removing a liquid remaining on the substrate W. The transfer chamber 300 transfers the substrate W between the buffer unit 200, the liquid treating chamber 400, and the drying chamber 500.

The transfer chamber 300 is provided with its length parallel to the first direction X. A buffer unit 200 is placed between the index module 10 and the transfer chamber 300. A liquid treating chamber 400 and a drying chamber 500 is placed at a surface of the transfer chamber 300. The liquid treating chamber 400 and the transfer chamber 300 are placed along the second direction Y. The drying chamber 500 and the transfer chamber 300 are placed along the second direction Y. The buffer unit 200 is placed at an end of the transfer chamber 300.

According to an embodiment, liquid treating chambers 400 may be disposed on both sides of the transfer chamber 300, drying chambers 500 may be disposed on both sides of the transfer chamber 300, and liquid treating chambers 400 may be disposed closer to the buffer unit 200 than the drying chambers 500. At one surface of the transfer chamber 300, the liquid treating chambers 400 may be provided in an array of A×B (A and B are each natural numbers of 1 or greater), respectively, along the first direction X and the third direction Z. In addition, at one surface of the transfer chamber 300, each of the drying chambers 500 may be provided in C×D (C and D are each natural numbers of 1 or greater) respectively, along the first direction X and the third direction Z. Unlike the above description, only liquid treating chambers 400 may be provided at one surface of the transfer chamber 300, and only drying chambers 500 may be provided at the other side thereof.

The transfer chamber 300 has a transfer robot 320. In the transfer chamber 300 a guide rail 324 may be provided, the guide rail 324 having its lengthwise direction in the first direction X, and the transfer robot 320 may be provided to be movable on the guide rail 324. The transfer robot 320 may include a hand 322 on which the substrate W is placed, and the hand 322 may be provided to be forwardly and backwardly movable, rotatable with the third direction Z as an axis, and movable in the third direction Z. A plurality of hands 322 are provided to be spaced apart in the up/down direction, and the hands 322 may be forwardly and backwardly movable independently of each other.

The buffer unit 200 includes a plurality of buffers 220 on which the substrate W is placed. The buffers 220 may be disposed to be placed apart from each other in the third direction Z. A front face and a rear face of the buffer unit 200 are opened. The front face is a surface facing the index module 10, and the rear face is a surface facing the transfer chamber 300. The index robot 120 may access the buffer unit 200 through the front face, and the transfer robot 320 may access the buffer unit 200 through the rear face.

Figure 4:
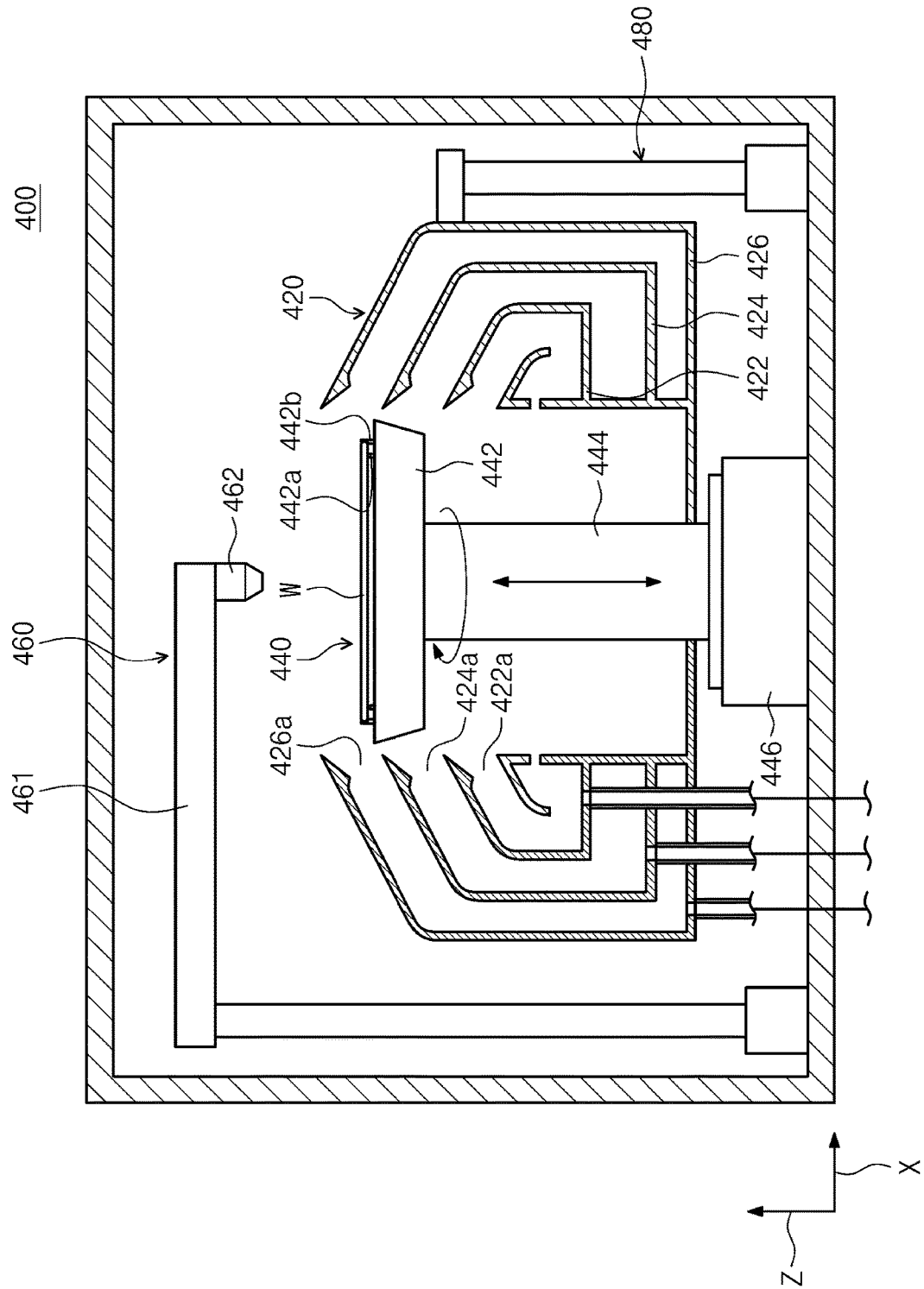
FIG. 4 is a view illustrating the substrate treating apparatus provided at a liquid treating chamber of FIG. 3.

FIG. 4 schematically illustrates an embodiment of the liquid treatment chamber of FIG. 3. Referring to FIG. 4, the liquid treating chamber 400 (i.e., a liquid treatment chamber) provided at the substrate treating apparatus may include a housing 410, a cup 420, a support unit 440, a liquid supply unit 460, and a lifting/lowering unit 480.

The housing 410 may have an inner space for treating the substrate W. The housing 410 may be provided in a substantially hexahedron shape. For example, the housing 410 may have a rectangular parallelepiped shape. Also, an opening (not shown) may be formed in a sidewall of the housing 410. The opening may function as an entrance/exit opening through which the substrate W enters or exits the inner space. In addition, in order to selectively open or close the opening, a door (not shown) may be provided at the housing 410.

The cup 420 may have a reversed U-shape. The cup 420 may have a treating space, and the substrate W may be liquid treated in the treating space. The support unit 440 supports the substrate W in the treating space. The liquid supply unit 460 supplies treating liquid to the substrate supported by the support unit 440. The treating liquid may be provided in a plurality, and may be sequentially supplied to the substrate W. The lifting/lowering unit 480 may adjust the relative heights of the cup 420 and the support unit 440.

According to an embodiment, the cup 420 has a plurality of recollecting containers 422, 424, and 426. Each of the recollecting containers 422, 424, and 426 has a recollecting space for recollecting the liquid used for the substrate treatment. Each of the recollecting containers 422, 424, and 426 are provided in a ring shape surrounding the support unit 440. During the liquid treatment process, the treating liquid scattered by the rotation of the substrate W is introduced into the recollecting space through inlets 422a, 424a, and 426a of each recollecting container 422, 424, and 426. According to an embodiment, the cup 420 has a first recollecting container 422, a second recollecting container 424, and a third recollecting container 426. The first recollecting container 422 is disposed to surround the support unit 440, the second recollecting container 424 is disposed to surround the first recollecting container 422, and the third recollecting container 426 is disposed to surround the second recollecting container 424. The second inlet 424a introducing a liquid into the second recollecting container 424 may be located above the first inlet 422a introducing the liquid into the first recollecting container 422, and the third inlet 426a introducing the liquid into the third recollecting container 426 may be located above the second inlet 424a.

The support unit 440 has a support plate 442 and a drive shaft 444. The top surface of the support plate 442 is provided in a substantially circular shape and may have a diameter larger than that of the substrate W. A support pin 442a is provided at a central part of the support plate 442 to support the bottom surface of the substrate W, and the support pin 442a is provided to protrude from the support plate 442 such that the substrate W is spaced apart from the support plate 442 by a predetermined distance. A chuck pin 442b is provided at the edge of the support plate 442. The chuck pin 442b is provided to upwardly protrude from the support plate 442, and supports the surface of the substrate W so that the substrate W is not separated from the support unit 440 when the substrate W is rotated. The drive shaft 444 is driven by the driver 446, is connected to a center of the bottom surface of the substrate W, and rotates the support plate 442 based on its central axis.

According to an embodiment, the liquid supply unit 460 may include a nozzle 462. The nozzle 462 may supply a treating liquid to the substrate W. The treating liquid may be a chemical, a rinsing liquid, or an organic solvent. The chemical may be a chemical with strong acid or strong alkaline properties. In addition, the rinsing liquid may be a deionized water. In addition, the organic solvent may be an isopropyl alcohol (IPA). In addition, the liquid supply unit 460 may include a plurality of nozzles 462, and each nozzle 462 may supply a different type of treating liquid. For example, one of the nozzles 462 may supply the chemical, another one of the nozzles 462 may supply the rinsing liquid, and another one of the nozzles 462 may supply the organic solvent. In addition, the controller 30 may control the liquid supply unit 460 to supply the organic solvent from another one of the nozzles 462 to the substrate W after supplying the rinsing liquid from another one of the nozzles 462. Accordingly, the rinsing liquid supplied onto the substrate W may be substituted with an organic solvent having a small surface tension.

The lifting/lowering unit 480 moves the cup 420 in the up/down direction. The relative height between the cup 420 and the substrate W is changed by the up/down movement of the cup 420. As a result, the recollecting containers 422, 424, 426 for recollecting the treating liquid are changed in accordance with the type of liquid supplied to the substrate W, so that the liquids can be recovered separately. Unlike the above description, the cup 420 may be fixedly installed, and the lifting/lowering unit 480 may move the support unit 440 in the up/down direction.

Figure 5:
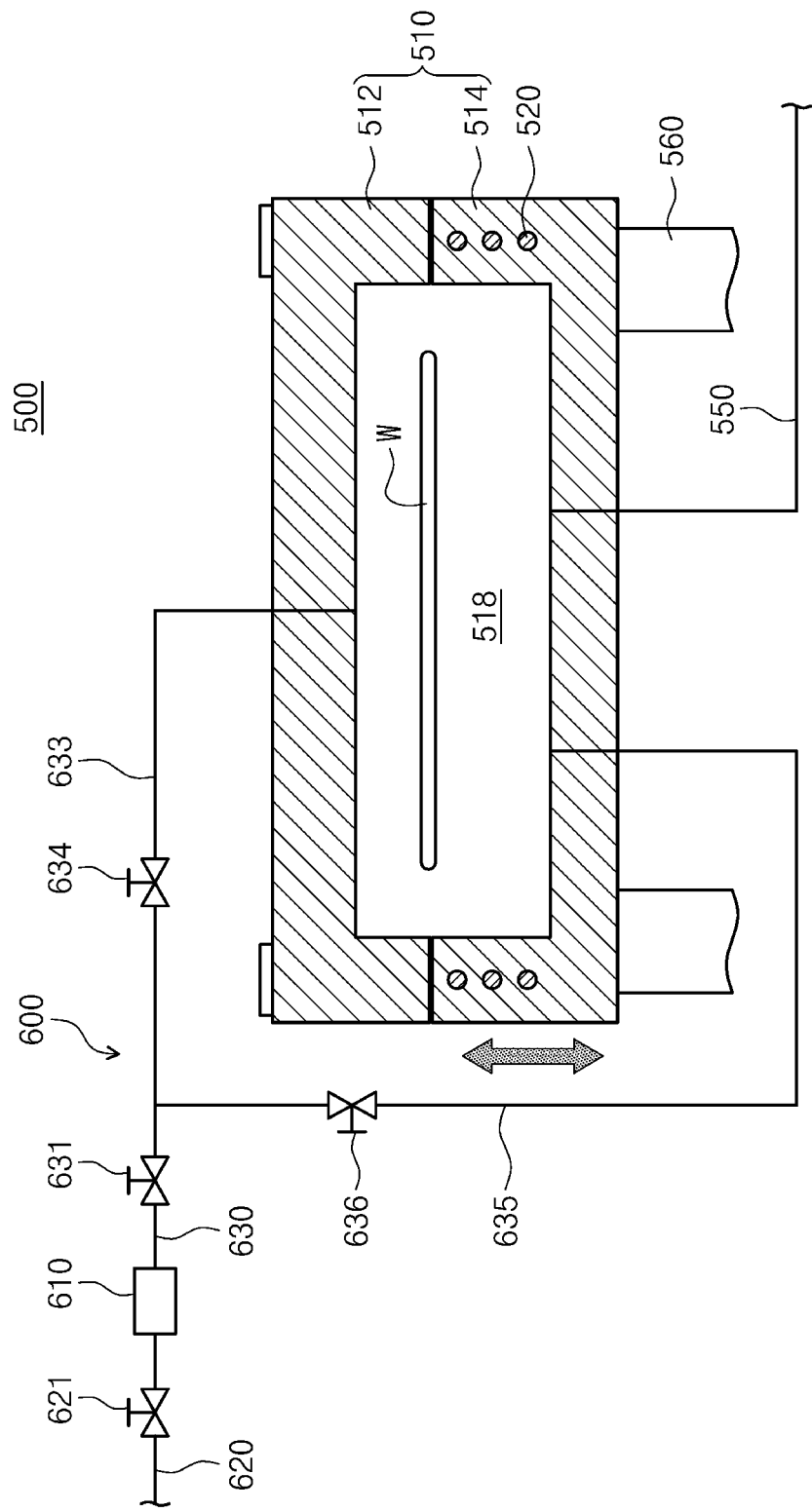
FIG. 5 is a view illustrating the substrate treating apparatus provided at a drying chamber of FIG. 3.

FIG. 5 is a view schematically illustrating a substrate treating apparatus provided at the drying chamber of FIG. 3. Referring to FIG. 5, the drying chamber 500 provided at the substrate treating apparatus may remove the treating liquid remaining on the substrate W by using a treating fluid in a supercritical state. For example, the drying chamber 500 provided at the substrate treating apparatus may perform a drying process of removing the organic solvent remaining on the substrate W using a carbon dioxide ($CO_2$) in a supercritical state.

The drying chamber 500 may include a chamber 510, a heating member 520, a fluid supply unit 600, a fluid exhaust line 550, and a lifting/lowering member 560. The chamber 510 may have a treating space 518 in which the substrate W is treated. The chamber 510 may provide a treating space 518 in which the substrate W is dry-treated by the treating fluid in the supercritical state. The treating space 518 may be referred to as a vessel.

The chamber 510 may include a top body 512 (an embodiment of a first body) and a bottom body 514 (an embodiment of a second body). The top body 512 and the bottom body 514 may be combined with each other to form the treating space 518 in which the substrate W is treated. The substrate W may be supported in the treating space 518. For example, the substrate W may be supported by a support member (not shown) in the treating space 518. The support member 513 may be configured to support the bottom surface of an edge region of the substrate W. Any one of the top body 512 or the bottom body 514 may be coupled to the lifting/lowering member 560 to be moved in the up/down direction. For example, the bottom body 514 may be coupled to the lifting/lowering member 560 to be moved in the up/down direction by the lifting/lowering member 560. Accordingly, the treating space 518 of the chamber 510 may be selectively sealed. In the above-described example, the bottom body 514 is coupled to the lifting/lowering member 560 to move in the up/down direction, but the inventive concept is not limited to it. For example, the top body 512 may be coupled to the lifting/lowering member 560 to move in the up/down direction.

The heating member 520 may heat the drying fluid G supplied to the treating space 518. The heating member 520 may phase-change the treating fluid G (for example, a high-pressure gas including $CO_2$) supplied to the treating space 518 into a supercritical state by raising a temperature of the treating space 518 of the chamber 510. In addition, the heating member 520 may raise the temperature of the treating space 518 of the chamber 510 to maintain the supercritical state of the supercritical treating fluid G supplied to the treating space 518.

In addition, the heating member 520 may be buried in the chamber 510. For example, the heating member 520 may be buried in any one of the top body 512 or the bottom body 514. For example, the heating member 520 may be provided in the top body 512 and the bottom body 514. However, the inventive concept is not limited thereto, and the heating member 520 may be provided at various positions capable of raising the temperature of the treating space 518. In addition, the heating member 520 may be a heater. However, the inventive concept is not limited thereto, and the heating member 520 may be variously modified into a known device capable of raising the temperature of the treating space 518.

The fluid supply unit 600 may supply the treating fluid to the treating space 518 of the chamber 510. The fluid supply unit 600 may supply the treating fluid in a heated state to the treating space 518 of the chamber 510. The fluid supply unit 600 may include a tank 610, a first supply line 620, and a second supply line 630. The first supply line 620 may be connected to a fluid supply source (not shown) to transfer a new treating fluid to the tank 610. A first valve 621 may be installed at the first supply line 620. The first valve 621 may be an on/off valve or a flow control valve. A temperature of the treating fluid supplied to the tank 610 may be controlled at the tank 610. For example, the treating fluid supplied to the tank 610 may be heated at the tank 610. The treating fluid heated at the tank 610 may be phase-changed from a gaseous state to a supercritical state. The treating fluid heated in the tank 610 may be supplied to the treating space 518 through the second supply line 630. A second valve 631 may be installed at the second supply line 630. The second valve 631 may be an on/off valve or a flow control valve.

In addition, the second supply line 630 may be branched into a plurality of supply lines. For example, one of the supply lines from which the second supply line 630 is branched may be a top supply line 633. In addition, the other of the supply lines from which the second supply line 630 is branched may be a bottom supply line 635. The top supply line 633 may supply the treating fluid to the treating space 518 in a direction from top to bottom. The bottom supply line 635 may supply the treating fluid to the treating space 518 in a downward-to-upward direction. The top supply line 633 may be connected to the top body 512. The bottom supply line 635 may be connected to the bottom body 514. A top valve 634 may be installed on the top supply line 633.

The top valve 634 may be an on/off valve or a flow control valve. In addition, a bottom valve 636 may be installed at the bottom supply line 635. The bottom valve 636 may be an on/off valve or a flow control valve.

The fluid exhaust line 550 may exhaust the treating fluid from the treating space 518 of the chamber 510. The fluid exhaust line 550 may be connected to a decompression member (not shown) such as a pump. In addition, an exhaust valve (not shown) may be installed at the fluid exhaust line 550. The exhaust valve may be an on/off valve or a flow control valve.

Figure 6:
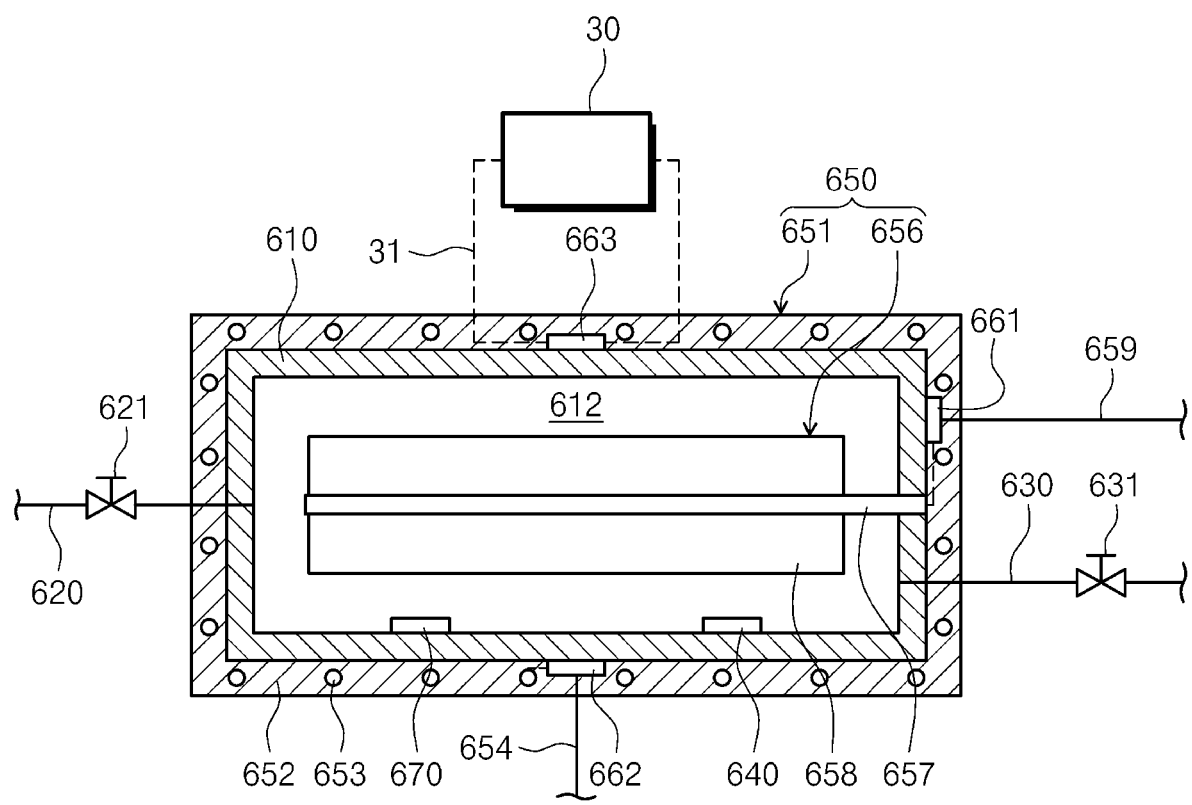
FIG. 6 is a view schematically illustrating a fluid supply unit of FIG. 5.

FIG. 6 is a view schematically illustrating a shape of the fluid supply unit of FIG. 5. Referring to FIG. 6, the fluid supply unit 600 according to an embodiment of the inventive concept may include a tank 610, the first supply line 620 described above, the first valve 621 described above, the second valve 631 described above, the pressure measuring member 640, the temperature controlling member 650, a bimetal 660, and a temperature measuring member 670.

The tank 610 may have an inner space 612. The tank 610 may be made of a material having a pressure resistance capable of enduring a high pressure, and a heat resistance capable of enduring high temperatures. In the inner space 612 of the tank 610, the treating fluid supplied to the inner space 612 may be heated. At least a portion of the treating fluid heated in the inner space 612 may be phase-changed from a gaseous state to a supercritical state.

The first supply line 620 may supply a new treating fluid to the inner space 612. The second supply line 630 may transfer the treating fluid heated from the inner space 612 to the treating space 518 of the chamber 510.

The pressure measuring member 640 may measure the pressure of the inner space 612. For example, the pressure measuring member 640 may measure the pressure of an atmosphere of the inner space 612. The pressure measuring member 640 may be disposed in the inner space 612. The pressure measuring member 640 may be a component having a specification capable of enduring a high pressure and a high temperature. The pressure value of the inner space 612 measured by the pressure measuring member 640 may be transferred to the controller 30 described above.

The temperature controlling member 650 may adjust the temperature of the inner space 612. For example, the temperature controlling member 650 may increase the temperature of the inner space 612. For example, the temperature controlling member 650 may transfer a heat to the atmosphere of the inner space 612. In addition, the temperature controlling member 650 may be controlled by the controller 30. For example, the controller 30 may control the temperature controlling member 650 in a PID manner. The temperature controlling member 650 may phase-change a gaseous treating fluid supplied to the inner space 612 into a supercritical state by heating the inner space 612. The temperature controlling member 650 may include a first temperature controlling member 651 and a second temperature controlling member 656. A heat generated by the temperature controlling member 650 may be a high heat. However, the inventive concept is not limited thereto, and the heat generated by the temperature controlling member 650 may be cold heat.

The first temperature controlling member 651 may generate a heat outside the tank 610 to control the temperature of the inner space 612. The first temperature controlling member 651 may be provided to surround an outer wall of the tank 610. The first temperature controlling member 651 may include a body 652 and a heating unit 653. The body 652 may be configured to surround an outer wall of the tank 610. A heating unit 653 may be installed at the body 652. The heating unit 653 may be electrically connected to the first power supply line 654 for transmitting a driving power to the heating unit 653. The first temperature controlling member 651 may be a jacket heater.

Figure 7:
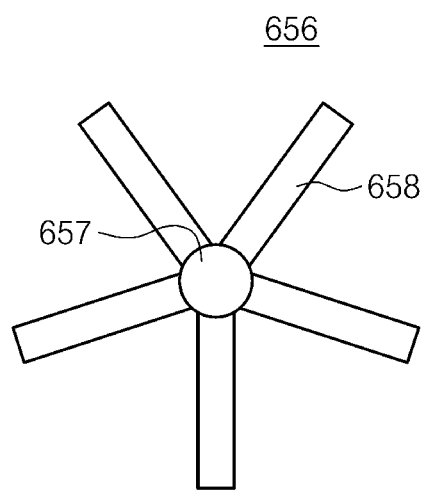
FIG. 7 is a view schematically illustrating a section of a second temperature controlling member of FIG. 6.

The second temperature controlling member 656 may generate a heat in the inner space 612 to adjust the temperature of the inner space 612. The second temperature controlling member 656 may include a shaft 657 and a heating plate 658. FIG. 7 shows a cross-sectional view of the second temperature controlling member 656 when the second temperature controlling member 656 is viewed from a lengthwise direction of the shaft 657, and at least one of the above-described heating plates 658 may be installed at the shaft 657 as is illustrated in FIG. 7. For example, a plurality of heating plates 658 may be installed at the shaft 657 to be spaced apart from each other at the same interval along a circumferential direction with respect to the shaft 657. The second temperature controlling member 656 may be electrically connected to the second power supply line 659 that transmits a driving power to the heating plate 658 and/or the shaft 657. The second temperature controlling member 656 may be a cartridge heater.

In addition, although FIG. 6 and FIG. 7 illustrate that one second temperature controlling member 656 is provided as an example, the inventive concept is not limited thereto. For example, a plurality of second temperature controlling members 656 may be provided. For example, a plurality of second temperature controlling members 656 may be provided to be spaced apart from each other. The plurality of second temperature controlling members 656 provided may be connected to each other by brazing or the like through a connection member disposed therebetween.

Figure 8:
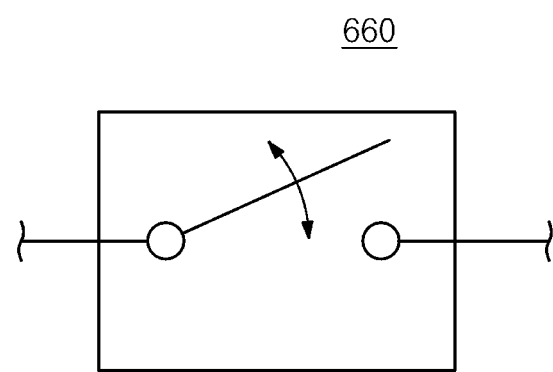
FIG. 8 is a view schematically illustrating a function of a bimetal of FIG. 6.

Referring back to FIG. 6, the fluid supply unit 600 of the inventive concept may further include a bimetal 660. The bimetal 660 may be a rod-shaped component made of a single sheet by stacking and attaching thin metal plates of very different thermal expansion coefficients. When a heat is applied to the bimetal 660, the bimetal 660 has a bending property. Accordingly, when a temperature of the bimetal 660 is excessively increased, the bimetal 660 may perform a function similar to that of a switch as illustrated in FIG. 8. When a temperature of the tank 610 is excessively increased using such properties of the bimetal 660, interlocks may be performed on the substrate treatment apparatus provided to the drying chamber 500 or the temperature controlling member 650 may stop generating the heat.

For example, as illustrated in FIG. 6, the bimetal 660 may include a first bimetal 661, a second bimetal 662, and a third bimetal 663. The first bimetal 661, the second bimetal 662, and the third bimetal 663 may be installed to be in contact with the tank 610, respectively. For example, the first bimetal 661, the second bimetal 662, and the third bimetal 663 may be installed on the outer wall of the tank 610.

The first bimetal 661 may be connected to a power supply line that supplies power to the second temperature controlling member 656. Accordingly, when the temperature of the tank 610 is excessively increased (for example, when the temperature is increased above a predetermined temperature), the shape of the first bimetal 661 is deformed to block power transferred to the second temperature controlling member 656.

The second bimetal 662 may be connected to a power supply line that supplies power to the first temperature controlling member 651. Accordingly, when the temperature of the tank 610 is excessively increased (for example, when the temperature is increased above a predetermined temperature), the shape of the second bimetal 662 is deformed to block power transferred to the first temperature controlling member 651.

The third bimetal 663 may be signal-connected to the controller 30. For example, the third bimetal 663 may be connected to a signal line 31. The signal line 31 may be a line that allows the controller 30 to receive a signal back in a feedback manner when the controller 30 generates a specific signal at a predetermined period. Accordingly, when the temperature of the tank 610 is excessively increased (for example, when the temperature is increased above a certain temperature), the shape of the third bimetal 663 is deformed. In this case, a specific signal generated by the controller 30 cannot be returned to the controller 30. In this case, the controller 30 may determine that the temperature of the tank 610 is excessively increased and generate an interlock that stops driving the substrate treating apparatus provided to the drying chamber 500.

The temperature measuring member 670 may be a temperature sensor that measures the temperature of the inner space 612. The temperature measuring member 670 may be provided as a sensor with excellent specifications in pressure resistance and thermal resistance so as to withstand the inner space 612 in a high pressure and high temperature state. The temperature value of the inner space 612 measured by the temperature measuring member 670 may be transferred to the controller 30.

Hereinafter, a method of controlling the temperature of the inner space 612 of the tank 610 storing the treating fluid transferred to the chamber 510 according to an embodiment of the inventive concept will be described in detail. The controller 30 may control at least one of the fluid supply unit 600 and the other components of the substrate treatment apparatus provided to the drying chamber 500 to perform the temperature control method described below.

Figure 9:
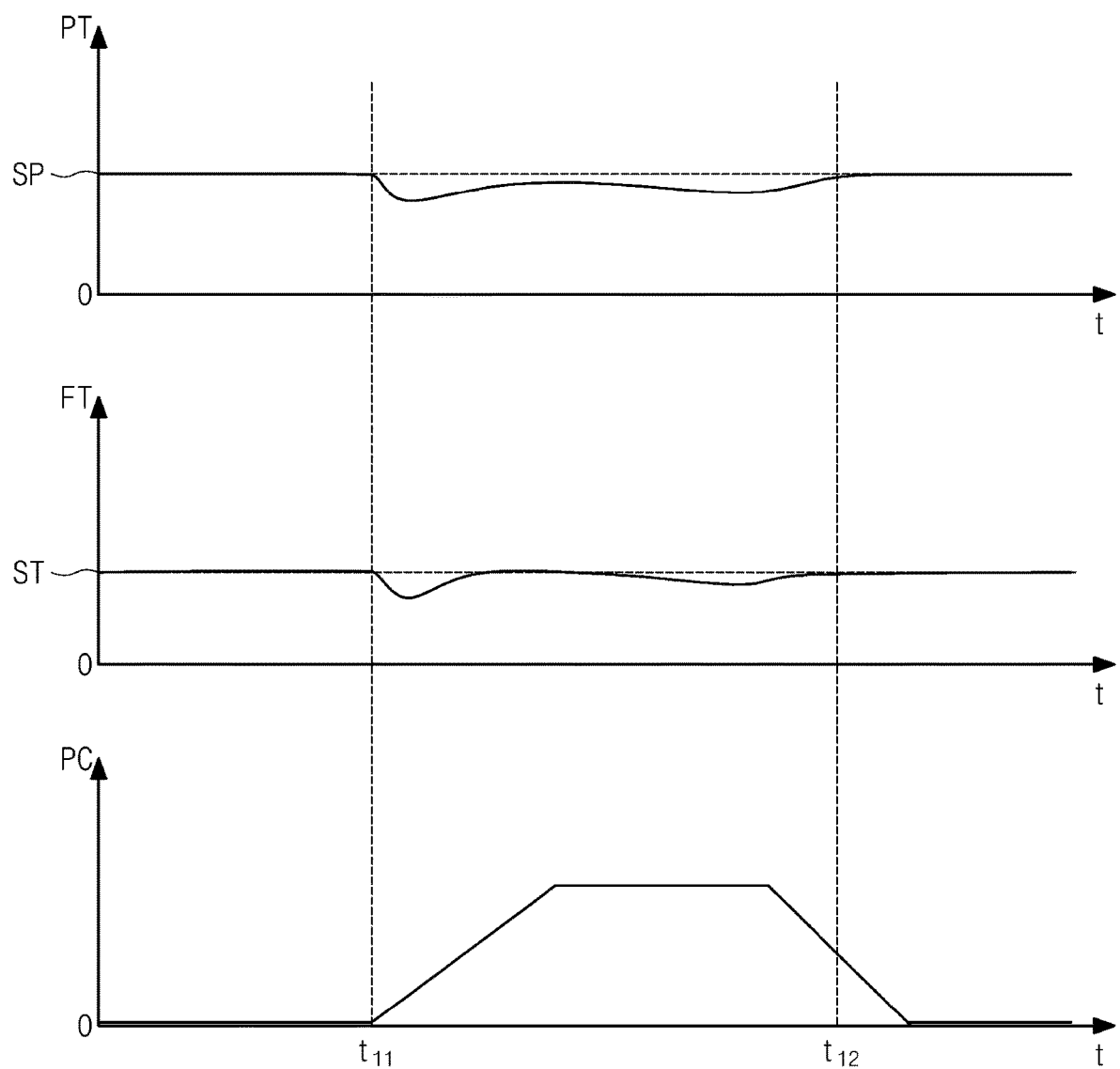
FIG. 9 is a graph illustrating a change of a pressure and a temperature of an inner space of the tank of FIG. 6, and a change of a pressure of a treating space of a chamber.

FIG. 9 is a graph illustrating a change in pressure and temperature of the inner space of the tank of FIG. 6, and a change in pressure of the treating space of the chamber. Hereinafter, a temperature control method according to an embodiment of the inventive concept will be described with reference to FIG. 9. In the graph shown in FIG. 9, the X-axis may denote time t, and the Y-axis may denote the pressure PT of the inner space 612, the temperature FT of the inner space 612, and the pressure PC of the treating space 518.

The first supply line 620 may supply a new treating fluid to the inner space 612 of the tank 610. The treating fluid supplied to the inner space 612 may be heated by a heat generated by the temperature controlling member 650. The heated treating fluid may be transferred to the treating space 518 of the chamber 510 through the second supply line 630. For example, the pressure of the treating space 518 gradually increases from a first time point t11 at which the supercritical treatment process for the substrate W starts in the treating space 518. When the pressure of the treating space 518 reaches a predetermined pressure, the pressure of the treating space 518 may be kept constant for a predetermined time. Alternatively, an increasing or decreasing of a pressure may be repeated for a predetermined time. In this case, the second valve 631 installed on the second supply line 630 may be turned on or off at least once. In addition, after the predetermined time has elapsed, the pressure of the treating space 518 may be lowered. The pressure of the treating space 518 may be lowered while the treating fluid supplied to the treating space 518 is discharged through the exhaust line 550.

When the first time point t11 is reached, the pressure of the inner space 612 may be lowered. This is because the treating fluid flows out of the inner space 612 and is transferred to the treating space 518. When the pressure of the inner space 612 is lowered, the first supply line 620 may supply a new treating fluid to the inner space 612. The temperature of the new treating fluid may be slightly lower than the temperature of the treating fluid remaining in the inner space 612. Accordingly, the temperature of the inner space 612 may be slightly lowered. In this case, the temperature controlling member 650 may adjust the temperature of the inner space 612. For example, the temperature controlling member 650 may adjust the temperature of the inner space 612 based on the pressure of the inner space 612 measured by the pressure measuring member 640. For example, the temperature controlling member 650 may increase the temperature of the inner space 612 based on the pressure measurement value of the inner space 612 measured by the pressure measuring member 640, and not the temperature measurement value of the inner space 612. For example, the temperature controlling member 650 may transfer heat to the inner space 612 so that the pressure of the inner space 612 may reach a predetermined pressure SP. For example, when the pressure of the inner space 612 is lower than the predetermined pressure SP, the temperature controlling member 650 may increase the temperature of the inner space 612 so that the pressure of the inner space 612 reaches the predetermined pressure SP. That is, since the temperature control of the inner space 612 by the temperature controlling member 650 is based on the pressure of the inner space 612 measured by the pressured measuring member 540, the temperature change of the inner space 612 and the pressure change of the inner space 612 may have similar patterns.

In a conventional substrate treating apparatus, the temperature control of the inner space 612 of the tank 610 is based on a temperature value measured by the temperature measuring member 670 that measures the temperature of the inner space 612 of the tank 610. In this case, the temperature value measured by the temperature measuring member 670 may vary depending on the position where the temperature measuring member 670 is disposed in the inner space 612. For example, when the temperature measuring member 670 is disposed adjacent to the first supply line 620, a temperature value measured by the temperature measuring member 670 may be somewhat low, and on the contrary, when the temperature measuring member 670 is disposed adjacent to the second supply line 630, a temperature value measured by the temperature measuring member 670 may be slightly high. That is, since a temperature deviation measured according to a position where the temperature measuring member 670 is disposed occurs, the temperature control of the inner space 612 by the temperature controlling member 650 may not be accurately performed. In addition, when the temperature controlling member 650 adjusts the temperature of the inner space 612 based on the temperature value measured by the temperature measuring member 670, a reactivity of the temperature controlling member 650 depends on the change in the temperature value measured by the temperature measuring member 670. However, since the change in the temperature value is based on a thermal conduction, the change in the temperature value measured by the temperature controlling member 650 is somewhat less sensitive. Accordingly, the reactivity of a temperature control by the temperature controlling member 650 is also low.

However, the temperature control of the inner space 612 according to an embodiment of the inventive concept is based on the pressure value measured by the pressure measuring member 640 rather than the temperature value measured by the temperature measuring member 670. Since all regions of the inner space 612 communicating with each other have the same pressure, there is no problem that a deviation occurs in the pressure value measured according to a position of the pressure measuring member 640. In addition, since a change in the pressure value of the pressure measuring member 640 is based on a flow of the treating fluid that may be in a supercritical state, the reactivity is very high. This may increase the reactivity of temperature control by the temperature controlling member 650.

In addition, since the temperature control of the inner space 612 by the temperature controlling member 650 is based on the pressure measurement value of the inner space 612, it is possible to minimize the occurrence of the above-described over-shooting problem.

Figure 10:
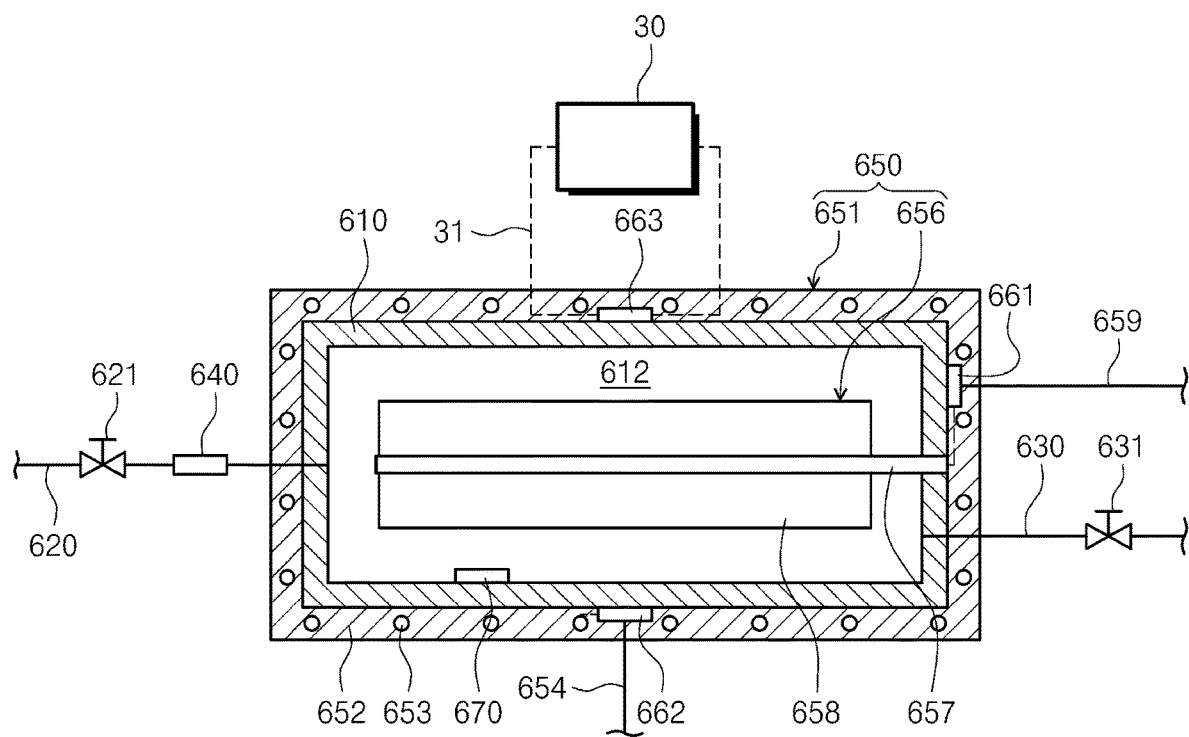
FIG. 10 is a view illustrating a fluid supply unit according to another embodiment of the inventive concept.

In the above-described example, the pressure measuring member 640 is installed in the inner space 612, but the inventive concept is not limited thereto. For example, as shown in FIG. 10, the pressure measuring member 640 may be installed at the first supply line 620 in fluid communication with the inner space 612.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:
1. A substrate treating apparatus comprising:
   a chamber having a treating space for treating a substrate;
   a fluid supply unit configured to supply a treating fluid to the treating space; and
   a controller,
   wherein the fluid supply unit comprises:
   a tank having an inner space;
   a first supply line supplying the treating fluid to the inner space;
   a second supply line transferring the treating fluid from the inner space to the treating space;
   a temperature controlling member configured to control a temperature of the inner space; and
   a pressure measuring member configured to measure a pressure of the inner space, and
      wherein the controller controls the temperature controlling member to control the temperature of the inner space, based on a measured pressure of the inner space measured by the pressure measuring member.
2. The substrate treating apparatus of claim 1,
   wherein the controller controls the temperature controlling member to adjust the temperature of the inner space so that the pressure of the inner space reaches a predetermined pressure.
3. The substrate treating apparatus of claim 2,
   wherein the controller, when the pressure of the inner space is lower than the predetermined pressure, controls the temperature controlling member to increase the temperature of the inner space so that the pressure of the inner space reaches the predetermined pressure.

4. The substrate treating apparatus of claim 1, wherein the temperature controlling member comprises at least one of a first temperature controlling member surrounding the tank, or a second temperature controlling member controlling the temperature of the inner space by generating a heat at the inner space.

5. The substrate treating apparatus of claim 4, wherein the second temperature controlling member comprises:
   a shaft; and
   at least one heating plate installed at the shaft.

6. The substrate treating apparatus of claim 1, wherein the fluid supply unit further comprises a bimetal, and the bimetal is installed to contact the tank and connected to a power supply line supplying power to the temperature controlling member.

7. The substrate treating apparatus of claim 1,
   wherein the fluid supply unit further comprises a bimetal, and
   wherein the bimetal contacts the tank and is connected to a signal line delivering a signal generated by the controller.

8. The substrate treating apparatus of claim 1,
   wherein the first supply line supplies the treating fluid in a gaseous state to the inner space, and
   wherein the temperature controlling member is configured to heat the inner space to change the treating fluid supplied to the inner space from the gaseous state to a supercritical state.

9. The substrate treating apparatus of claim 1, wherein the pressure measuring member is placed in the inner space, or installed on the first supply line.

10. A substrate treating apparatus comprising:
    a chamber having a treating space for treating a substrate using a treating fluid in a supercritical state;
    a fluid supply unit configured to supply the treating fluid to the treating space; and
    a controller controlling the fluid supply unit,
    wherein the fluid supply unit comprises:
    a tank having an inner space;
    a first supply line supplying the treating fluid to the inner space;
    a second supply line transferring the treating fluid from the inner space to the treating space;
    a heater transferring a heat to an atmosphere of the inner space; and
    a pressure measuring member measuring a pressure of the inner space, and
    wherein the controller controls the heater to transfer the heat to the atmosphere of the inner space so that the pressure of the inner space measured by the pressure measuring member reaches a predetermined pressure.

11. The substrate treating apparatus of claim 10,
    wherein the controller controls the heater to increase a temperature of the inner space so that the pressure of the inner space reaches the predetermined pressure, when the pressure of the inner space measured by the pressure measuring member is lower than the predetermined pressure.

12. The substrate treating apparatus of claim 10,
    wherein the fluid supply unit further comprises a second valve installed at the second supply line, and
    wherein the controller sets the second valve 'On' or 'Off' at least once.

13. The substrate treating apparatus of claim 10, wherein the fluid supply unit further comprises a bimetal, and the bimetal is installed to contact the tank and connects to a power supply line supplying power to the heater.

* * * * *